United States Patent
Cen et al.

(10) Patent No.: US 11,859,277 B2
(45) Date of Patent: *Jan. 2, 2024

(54) CATALYST ENHANCED MOLYBDENUM DEPOSITION AND GAP FILL

(71) Applicant: Applied Materials, Inc., Santa Clara, CA (US)

(72) Inventors: Xi Cen, San Jose, CA (US); Kai Wu, Palo Alto, CA (US); Seshadri Ganguli, Sunnyvale, CA (US); Xinming Zhang, Santa Clara, CA (US); Norman L. Tam, San Jose, CA (US); Abhilash Mayur, Salinas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 118 days.

This patent is subject to a terminal disclaimer.

(21) Appl. No.: 17/327,118

(22) Filed: May 21, 2021

(65) Prior Publication Data

US 2022/0372617 A1  Nov. 24, 2022

(51) Int. Cl.
  *C23C 16/06* (2006.01)
  *C23C 16/14* (2006.01)

(52) U.S. Cl.
  CPC .................... *C23C 16/14* (2013.01)

(58) Field of Classification Search
  None
  See application file for complete search history.

(56) References Cited

U.S. PATENT DOCUMENTS

| | | |
|---|---|---|
| 2008/0284030 A1 | 11/2008 | Yang et al. |
| 2014/0030532 A1 | 1/2014 | Byun et al. |
| 2018/0082942 A1* | 3/2018 | Chawla ............. H01L 21/76814 |
| 2018/0261624 A1 | 9/2018 | Ishikura et al. |
| 2019/0267282 A1 | 8/2019 | Gstrein et al. |
| 2019/0390340 A1* | 12/2019 | Yu .................... C23C 16/45544 |

FOREIGN PATENT DOCUMENTS

| | | | | |
|---|---|---|---|---|
| JP | 2008078647 A | * | 4/2008 | ......... C23C 16/0272 |
| JP | 4850354 B2 | * | 1/2012 | ....... H01L 21/76807 |
| JP | 2018035375 A | | 3/2015 | |
| WO | WO-2011050073 A1 | * | 4/2011 | ............. C23C 16/18 |

OTHER PUBLICATIONS

PCT International Search Report and Written Opinion in PCT/US2022/029429 dated Aug. 31, 2022, 10 pages.

* cited by examiner

*Primary Examiner* — David P Turocy
(74) *Attorney, Agent, or Firm* — Servilla Whitney LLC

(57) ABSTRACT

Methods of depositing a metal film are discussed. A metal film is formed on the bottom of feature having a metal bottom and dielectric sidewalls. Formation of the metal film comprises exposure to a metal precursor and an alkyl halide catalyst while the substrate is maintained at a deposition temperature. The metal precursor has a decomposition temperature above the deposition temperature. The alkyl halide comprises carbon and halogen, and the halogen comprises bromine or iodine.

7 Claims, 4 Drawing Sheets

CATALYST ENHANCED MOLYBDENUM DEPOSITION AND GAP FILL

TECHNICAL FIELD

Embodiments of the disclosure generally relate to methods for depositing metal films. Some embodiments of the disclosure are directed to methods for depositing metal films. Some embodiments of the disclosure relate to the selective deposition of metal films. Some embodiments of the disclosure control the location and/or rate of deposition through the use of plasma and/or thermal exposure conditions.

BACKGROUND

The semiconductor industry continues to strive for continuous device miniaturization that is driven by the need for mobile and high-performance systems in emerging industries such as autonomous vehicles, virtual reality, and future mobile devices. To accomplish this feat, new, high-performance materials are needed to circumvent inherent engineering, chemical and physics issues encountered in the rapid reduction of features in microelectronic devices.

In the current state of the art, structures are filled by CVD or electrochemical plating (ECP) processes. In CVD processes where the deposition happens all over the structure, a void is usually formed when the films merge due to roughness, leaving a seam in the gap. ECP processes are restricted by size and whether a process for the required material exists.

Additionally, as the design of semiconductor devices evolve, precision material manufacturing in the semiconductor industry has entered an era of atomic scale dimensions. At the atomic scale, with only tens of atoms at stake, there is little margin for error. This unprecedented challenge demands new material processing techniques which have atomic level precision. However, increasing the complexity of the process flow required in atomic scale device manufacturing can significantly lower throughput and increase the cost of manufacturing.

High current densities of Molybdenum (Mo) thin films are proposed for applications of semiconductor and microelectronic devices, for example buried word line in DRAM application. Current major approach involves TiN full fill or W/TiN deposition. However, both approaches face high resistivity issues in smaller structure for future generation. New low resistivity fill materials are needed. Ru or Mo are two of major candidates. However, Ru is unstable under high temperature, and tends to pull up and leave a big bottom void after going through thermal budget. The pull-up issue is mainly material related, and hence can not be easily solved. For Mo, current common processes use molybdenum oxychloride ($MoOCl_4$) precursor and $H_2$ as reducing agent. However, the process usually requires high temperature (above 550° C.) that shows rough surface and chamber instability. Furthermore, chlorine also brings concerns regarding the interface between in microelectronic devices. Accordingly, there is a need in the art for new precursors and deposition methods to form reasonable molybdenum gap fill and is void-free after annealing

SUMMARY

One or more embodiments of the disclosure are directed to metal deposition methods. A substrate having at least one feature comprising a bottom and sidewalls is exposed to alternating pulses of a zero-valent metal arene precursor and an alkyl halide catalyst. The substrate is maintained at a deposition temperature to form a metal film on the bottom of the feature. The bottom of the feature comprises a metal and the sidewalls of the feature comprise a dielectric. The metal precursor has a decomposition temperature above the deposition temperature. The alkyl halide comprises carbon and halogen, and the halogen comprises bromine or iodine.

Additional embodiments of the disclosure are directed to methods of forming a seam-free gap fill. A second metal film is deposited in a feature on a substrate to partially fill the feature with the second metal film. The feature comprises a bottom and at least one sidewall. The bottom comprises a first metal and the at least one sidewall comprises a dielectric. The second metal film is formed selectively on the bottom relative to the at least one sidewall and has a top surface below a top surface of the dielectric. A liner is deposited on the sidewall of the feature above the second metal film. The feature is filled with the second metal film to cover the liner and the top surface of the dielectric. The second metal film and at least some of the liner are removed from the top surface of the dielectric and at least some of the dielectric to form a seam-free gap fill.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
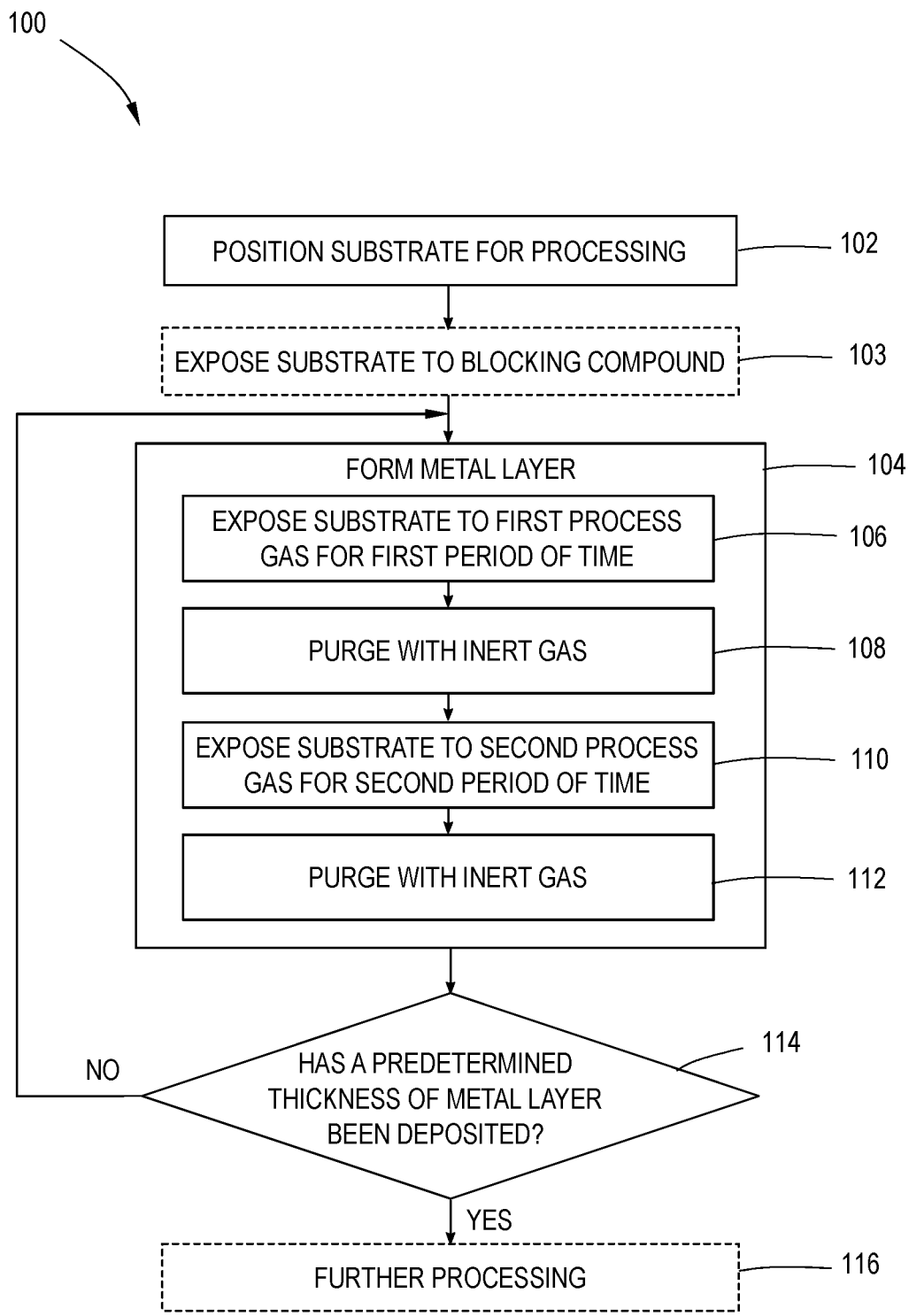
FIG. 1 illustrates an exemplary process sequence for the formation of a metal layer using a two pulse cyclical deposition technique according to one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process routines set forth in the following description. The disclosure is capable of other embodiments and of being practiced or being carried out in various ways.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., metal precursor gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used in this specification and the appended claims, the terms "precursor", "reactant", "reactive gas" and the like are used interchangeably to refer to any gaseous species that can react with the substrate surface.

Some embodiments of the disclosure provide methods for depositing a high purity metal film. The methods of various embodiments use atomic layer deposition (ALD) to provide pure or nearly pure metal films. While exemplary embodiments of this disclosure refer to the deposition of molybdenum, it is conceived that the principles of this disclosure enable the deposition of highly pure metal films regardless of metal.

Some embodiments of the disclosure advantageously provide methods for depositing metal films with high purity. Accordingly, these highly pure films exhibit similar properties to their associated bulk metallic materials. For example, some embodiments of this disclosure provide molybdenum films which are smoother and have lower resistance than molybdenum films deposited by conventional oxygen or hydrogen reactant processes. Some embodiments of this disclosure advantageously provide metal films which conformally fill gaps without a seam.

Some embodiments of the disclosure advantageously provide for the selective deposition of metal films with high purity on metallic surfaces over dielectric surfaces. For example, selectively depositing metal (e.g., molybdenum) on copper over dielectrics advantageously provides copper capping layers without additional etch or lithography steps. Additionally, selective deposition may also enable bottom-up gapfill for features (e.g., trenches, vias) with metal contacts at the bottom and dielectric sidewalls.

Some embodiments of the disclosure advantageously provide for the selective deposition of metal films with high purity on dielectric surfaces over metallic surfaces. For example, selectively depositing metals over dielectrics advantageously provides metal layers on barriers or other dielectrics in back end applications.

Some embodiments of the disclosure provide stable metal-organic molybdenum (Mo) precursors with halogen atom containing catalyst for atomic layer deposition. Some embodiments provide metal oxide chemical vapor deposition (MOCVD) processes with good gap fill that is void-free after annealing.

FIG. 1 depicts a generalized method for forming a metal film on a substrate in accordance with one or more embodiment of the disclosure. The method 100 generally begins at 102, where a substrate upon which a metal film is to be formed is provided and placed into a processing chamber. Providing a substrate for processing means that the substrate is placed into a position suitable for the deposition technique. For example, providing a substrate for processing in a chemical vapor deposition chamber means that the substrate is located on a suitable support and in a suitable processing chamber. As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the metal film, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the metal film may be, at least partially, formed thereon. For example, in some embodiments, a layer comprising a metal, a nitride, an oxide, or the like, or combinations thereof may be disposed on the substrate and may have the metal film formed upon such layer or layers.

At 103, the substrate is optionally exposed to a blocking compound. This process step is described more fully below and may be useful for controlling the selectivity of the deposition process on a substrate comprising both a metal surface and a dielectric surface. In some embodiments, no blocking compound is used to deposit the metal film on the substrate.

At 104, a metal film is formed on the substrate. The metal film may be formed via a cyclical deposition process, such as atomic layer deposition (ALD), or the like. In some embodiments, the forming of a metal film via a cyclical deposition process may generally comprise exposing the substrate to two or more process gases separately. In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiment of a time-domain ALD or spatial ALD process, the sequence may be repeated until a predetermined layer thickness is formed on the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The process of forming the metal film at 104 may begin by exposing the substrate to a first reactive gas. The first reactive gas comprises an alkyl halide and is exposed to the substrate for a first period of time, as shown at 106.

The alkyl halide may be any suitable reactant to adsorb a layer of halogen on the substrate for later reaction. In some embodiments, the alkyl halide comprises carbon and halogen. In some embodiments, the halogen comprises bromine or iodine. In some embodiments, the halogen is insoluble in the metal film. As used in this regard, a halogen which is insoluble in a metal film comprises less than or equal to about 2%, less than or equal to about 1%, or less than or equal to about 0.5% of the metal film on an atomic basis. In some embodiments, the alkyl halide has the general formula R—X, where R is an alkyl, alkenyl, aryl, or other carbonaceous group. In some embodiments, R comprises one to two, one to four, or one to six carbon atoms. In some embodiments, the alkyl halide comprises or consists essentially of iodoethane ($C_2H_5I$) or diiodomethane ($CH_2I_2$), iodomethane ($CH_3I$), iodopropane ($C_3H_7I$), iodobutane ($C_4H_9I$). As used in this regard, an alkyl halide which consists essentially of a stated species comprises greater than 95%, 98%, 99% or 99.5% of the stated species on a molar basis, excluding any inert diluent gases.

The alkyl halide is delivered to the processing chamber as an alkyl halide containing gas. The alkyl halide containing gas may be provided in one or more pulses or continuously. The flow rate of the alkyl halide containing gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The alkyl halide containing gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to the alkyl halide containing gas may be any suitable amount of time necessary to allow the alkyl halide to form an adequate adsorption layer atop the substrate surface(s). For example, the process gas may be flowed into the process chamber for a period of about 0.1 seconds to about 90 seconds. In some time-domain ALD processes, the alkyl halide containing gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the alkyl halide containing gas. The inert gas may be mixed with the alkyl halide containing gas (e.g., as a diluent gas) or be provided separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, or combinations thereof.

The temperature of the substrate during deposition can be controlled, for example, by setting the temperature of the substrate support or susceptor. In some embodiments the substrate is held at a temperature in the range of about 0° C. to about 600° C., or in the range of about 25° C. to about 500° C., or in the range of about 50° C. to about 450° C., or in the range of about 100° C. to about 400° C., or in the range of about 200° C. to about 400° C., or in the range of about 250° C. to about 350° C. In some embodiments, the substrate is maintained at a temperature below the decomposition temperature of the metal precursor. In some embodiments, the substrate is maintained at a temperature below the decomposition temperature of the alkyl halide. In some embodiments, the substrate is maintained at a temperature between the decomposition temperature of the alkyl halide and the decomposition temperature of the metal precursor.

In one or more embodiments, the substrate is maintained at a temperature less than or equal to about 400° C., or less than or equal to about 350° C., or less than about 300° C. In one or more embodiments, the substrate is maintained at a temperature greater than or equal to about 250° C., or greater than or equal to about 300° C., or greater than about 350° C. In some embodiments, the substrate is maintained at a temperature of about 280° C.

In addition to the foregoing, additional process parameters may be regulated while exposing the substrate to the alkyl halide containing gas. For example, in some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

Next, at 108, the process chamber (especially in time-domain ALD) may be purged using an inert gas. (This may not be needed in spatial ALD processes as there are gas curtains separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the alkyl halide containing gas at 706. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of about 0 to about 10000 sccm to purge the process chamber. In spatial ALD, purge gas curtains are maintained between the flows of reactive gases and purging the process chamber may not be necessary. In some embodiments of a spatial ALD process, the process chamber or region of the process chamber may be purged with an inert gas.

The flow of inert gas may facilitate removing any excess first process gas components and/or excess reaction byproducts from the process chamber to prevent unwanted gas phase reactions of the first and second process gases.

Next, at 110, the substrate is exposed to a second process gas for a second period of time. The second process gas comprises a metal precursor which reacts with the adsorbed layer of halogen on the substrate surface to deposit a metal film. The second reactive gas may also be referred to as the metal precursor gas.

The metal precursor may be any suitable precursor to react with the adsorbed halogen layer on the substrate. In some embodiments, the metal precursor comprises a metal center and one or more ligands. In some embodiments, the metal center comprises one or more metal atoms. Stated differently, in some embodiments, the metal precursor is one or more of a dimer, trimer or tetramer.

The metal precursor of some embodiments comprises a molybdenum (Mo) precursor. In some embodiments, the molybdenum precursor comprises an $(arene)_2Mo$. Examples of suitable precursors include, but are not limited to, $Mo(EtBz)_2$, $Mo(Et_3Bz)_2$, $Mo(Me_2Bz)_2$, $Mo(Me_3Bz)_2$, $Mo(toluene)_2$). In some embodiments, an iodine related catalyst (for example, $CH_2I_2$, $C_2H_5I$, $CH_3I$) is co-flowed with the molybdenum precursor, pulsed into the molybdenum precursor (or vice versa) or separately exposed from the molybdenum precursor.

As temperature increases, the thermal decomposition of Mo precursor starts from 150° C., but with high impurity and high resistivity. As temperature rises, the resistivity gets lower, and starts to form MoC from 450° C. To get purer Mo film instead of MoC, in some embodiments the halogen atom containing catalysts are incorporated to improve deposition.

In some embodiments, the general process is an ALD process with Mo precursor and catalyst as two alternating precursors flowing into chamber with purge in between. The iodine catalyst on the Mo metallic surface can break down L-Mo bond to produce Mo-I bond and eventually Mo-Mo formation during the catalytic surface reaction. However, the thermal energy required to break Mo-I bond is high. Therefore high deposition temperature (e.g., 425° C.-475° C.) is needed.

In some embodiments, deposition occurs at lower temperature (e.g., 250° C.-400° C.) where the thermal energy is insufficient to break Mo-I bonds. In embodiments of this sort, the deposited film contains carbon, large amount of I and oxygen as impurities. In some embodiments, the film impurities are reduced by $H_2$ or H* radical annealing. The metal of the metal precursor corresponds to the metal of the deposited metal film. In some embodiments, the metal is selected from molybdenum, ruthenium, cobalt, copper, platinum, nickel or tungsten. In some embodiments, the metal of the metal precursor has an oxidation state of 0. Stated differently, in some embodiments, the metal precursor comprises a zero-valent metal complex.

The metal precursor of some embodiments is a metal arene precursor. In some embodiments the metal precursor is a molybdenum arene compound. Suitable examples of molybdenum arene compounds include, but are not limited to, Mo(EtBz)$_2$, Mo(Et$_3$Bz)$_2$, Mo(Me$_2$Bz)$_2$, Mo(Me$_3$Bz)$_2$, Mo(toluene)$_2$). In some embodiments, the arene ligand comprises one or more of o-, m- or p-xylene.

Additional process parameters may be regulated while exposing the substrate to the metal precursor gas. For example, in some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

The metal precursor is delivered to the processing chamber as a metal precursor gas. The metal precursor gas may be provided in one or more pulses or continuously. The flow rate of the metal precursor gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The metal precursor gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to the metal precursor gas may be any suitable amount of time necessary to allow the metal precursor to react with the adsorbed halogen on the substrate surface. For example, the process gas may be flowed into the process chamber for a period of about 0.1 seconds to about 90 seconds. In some time-domain ALD processes, the metal precursor gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the metal precursor gas. The inert gas may be mixed with the metal precursor gas (e.g., as a diluent gas) or be provided separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, or combinations thereof.

Next, at 112, the process chamber may be purged using an inert gas. The inert gas may be any inert gas, for example, such as argon, helium, neon, or the like. In some embodiments, the inert gas may be the same, or alternatively, may be different from the inert gas provided to the process chamber during previous process routines. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

While the generic embodiment of the processing method shown in FIG. 1 includes only two pulses of reactive gases, it will be understood that this is merely exemplary and that additional pulses of reactive gases may be used. In some embodiments, the method is performed without the use of an oxygen-containing reactive gas. The sub processes of 104 comprise a cycle. A cycle may be performed in any order as long as the reactive gases are separated by a purge of the processing chamber. In some embodiments, the metal film is deposited at rate greater than or equal to about 0.2 Å/cycle, greater than or equal to about 0.3 Å/cycle, greater than or equal to about 0.4 Å/cycle, greater than or equal to about 0.5 Å/cycle, greater than or equal to about 0.6 Å/cycle, greater than or equal to about 0.7 Å/cycle, greater than or equal to about 0.8 Å/cycle, greater than or equal to about 0.9 Å/cycle, greater than or equal to about 1.0 Å/cycle, or greater than or equal to about 1.2 Å/cycle.

In some embodiments, the deposition process is performed as a thermal process without the use of plasma reactants. Stated differently, in some embodiments, the method is performed without plasma. In some embodiments, the deposition process is plasma-enhanced or incorporates use of radicals and/or ions generated in a remote plasma.

Next, at 114, it is determined whether the metal film has achieved a predetermined thickness. If the predetermined thickness has not been achieved, the method 100 returns to 104 to continue forming the metal film until the predetermined thickness is reached. Once the predetermined thickness has been reached, the method 100 can either end or proceed to 116 for optional further processing (e.g., bulk deposition of another metal film). In some embodiments, the metal film may be deposited to form a total layer thickness of about 10 Å to about 10,000 Å, or in some embodiments, about 10 Å to about 1000 Å, or in some embodiments, about 50 Å to about 5,000 Å.

In some embodiments, the metal layer comprises greater than or equal to about 85 atomic % molybdenum, or greater than or equal to about 90 atomic % molybdenum, or greater than or equal to about 95 atomic % molybdenum, or greater than or equal to about 98 atomic % molybdenum.

In some embodiments, the metal layer comprises less than or equal to about 5 atomic % oxygen, or less than or equal to about 4 atomic % oxygen, or less than or equal to about 3 atomic % oxygen, or less than or equal to about 2 atomic % oxygen, or less than or equal to about 1 atomic % oxygen, or less than or equal to about 0.5 atomic % oxygen, or less than or equal to about 0.25 atomic % oxygen.

In some embodiments, the metal layer comprises in the range of about 0.02 to about 5 atomic % iodine, or less than or equal to about 1 atomic % iodine.

In some embodiments, the metal layer comprises less than or equal to about 20 atomic % carbon, or less than or equal to about 15 atomic % carbon, or less than or equal to about 10 atomic % carbon, or less than or equal to about 5 atomic % carbon.

In some embodiments, the metal layer comprises greater than or equal to about 90 atomic % molybdenum, less than or equal to about 3 atomic % oxygen, less than or equal to about 1 atomic % iodine and less than or equal to about 10 atomic % carbon.

In some embodiments, the metal layer has a resistivity of less than or equal to about 40 μohm-cm, or less than or equal to about 35 μohm-cm, or less than or equal to about 30

μohm-cm, or less than or equal to about 25 μohm-cm, or less than or equal to about 20 μohm-cm. In some embodiments, the metal layer comprises molybdenum and has a resistivity of less than or equal to about 40 μohm-cm, or less than or equal to about 35 μohm-cm, or less than or equal to about 30 μohm-cm, or less than or equal to about 25 μohm-cm, or less than or equal to about 20 μohm-cm.

In some embodiments, the metal film is further processed by annealing the metal film. Without being bound by theory, it is believed that annealing the film at a high temperature under an Ar or $H_2$ atmosphere reduces carbon and halogen impurities in the metal film. In some embodiments, the metal film is annealed under an atmosphere comprising argon or hydrogen gas ($H_2$) to reduce the atomic concentration of carbon and/or halogen impurities.

The metal film deposited by some embodiments is smoother than the films deposited by known oxygen-based deposition processes. In some embodiments, the metal film has a surface roughness of less than or equal to about 10%, less than or equal to about 8%, less than or equal to about 5%, or less than or equal to about 2%, of a thickness of the metal film.

Some embodiments of the disclosure selectively deposit a first metal film on a second metal surface over a first dielectric surface. These methods are similar to method 100 as described above, except that the substrate provided comprises a first dielectric surface and a second metal surface. The first metal (of the metal film) and the second metal (of the substrate surface) may be the same metal or may be different metals. In some embodiments, the first metal is molybdenum, ruthenium, cobalt, copper, platinum, nickel or tungsten while the second metal is tungsten, cobalt or copper.

The first dielectric surface may be formed from any suitable dielectric material. In some embodiments, the dielectric material comprises nitrogen or oxygen atoms. Without being bound by theory, it is believed that these materials react with the alkyl halide and prevent the halogen from adsorbing onto the substrate surface so as to catalyze the reaction with the metal precursor. Accordingly, little, if any, metal film is formed on the dielectric surface.

In some embodiments, the deposition temperature is below the decomposition temperature of the alkyl halide. Again, without being bound by theory, it is believed that if the alkyl halide decomposes, the halogen will be available for reaction with the metal precursor on all surfaces (regardless of composition), leading to metal film deposition on all substrate surfaces, including the dielectric surface. In some embodiments, the deposition temperature is at or above the decomposition temperature of the alkyl halide.

Some embodiments of the disclosure selectively deposit a first metal film on a first dielectric surface over a second metal surface. These methods are similar to method 100 as described above, except that the substrate provided comprises a first dielectric surface and a second metal surface and the substrate is exposed to a blocking compound at 103.

At 103, a substrate comprising at least a second metal surface and a first dielectric surface is exposed to a blocking compound. The blocking compound may be any suitable compound for blocking deposition on the second metal surface. In some embodiments, the blocking compound comprises at least one triple bond between two carbon atoms. Stated differently, in some embodiments, the blocking compound comprises an alkyne. In some embodiments, the blocking compound has the general formula of R'≡R". In some embodiments, R' and R" are identical. In some embodiments, R' and/or R" are an alkyl or other carbonaceous group. In some embodiments, the blocking compound comprises 4-12 carbon atoms. In some embodiments, R' and/or R" are linear. In some embodiments, R' and/or R" are branched. In some embodiments, the blocking compound comprises 3-hexyne.

The first metal (of the metal film) and the second metal (of the substrate surface) may be the same metal or may be different metals. In some embodiments, the first metal is molybdenum, ruthenium, cobalt, copper, platinum, nickel or tungsten while the second metal is tungsten, cobalt or copper.

The first dielectric surface may be formed from any suitable dielectric material. In some embodiments, the dielectric material comprises nitrogen or oxygen atoms.

As mentioned previously, in some embodiments, the deposition temperature is at or above the decomposition temperature of the alkyl halide. In some embodiments, the deposition temperature is greater than or equal to about 250° C., greater than or equal to about 260° C., greater than or equal to about 270° C., greater than or equal to about 280° C., greater than or equal to about 290° C., or greater than or equal to about 300° C. In some embodiments, the deposition temperature is in the range of about 250° C. to about 450° C., or in the range of about 300° C. to about 400° C. In some embodiments, the deposition temperature is about 350° C.

As stated previously, without being bound by theory, it is believed that these materials react with the alkyl halide and prevent the halogen from adsorbing onto the substrate surface so as to catalyze the reaction with the metal precursor. Accordingly, little, if any, metal film is formed on the dielectric surface.

However, when the deposition temperature is above the decomposition temperature of the alkyl halide, the halogen atoms are deposited on the entire substrate surface, thereby allowing deposition on the dielectric surface. In some embodiments, the metal surface is blocked by the blocking compound, so as to allow little, if any, metal film to be formed on the metal surface. Accordingly, deposition of the metal film is selective to the dielectric surface over the metal surface, In general terms, the deposition according to some embodiments of highly pure metal films can be understood as follows. A substrate, maintained at a deposition temperature, is exposed to an alkyl halide (R—X) to adsorb R and X on the substrate, where R is a carbonaceous group and X is a halogen. R is desorbed in the form of R—R or R⁻, leaving X adsorbed on the substrate. The substrate is exposed to a metal precursor, M—L, where M is the metal and L is a ligand. M—L reacts with the adsorbed X to form M—X on the substrate surface, liberating L. M—X reacts with other M—X moieties on the substrate to form M—M. This reaction may produce either X—X or X⁻. X—X may be desorbed and purged. X⁻ may remain on the surface to further react with M—L.

Some embodiments of the disclosure advantageously provide methods of depositing conformal metal films on substrates comprising high aspect ratio structures. As used in this regard, the term "conformal" means that the thickness of the metal film is uniform across the substrate surface. As used in this specification and the appended claims, the term "substantially conformal" means that the thickness of the metal film does not vary by more than about 10%, 5%, 2%, 1%, or 0.5% relative to the average thickness of the film. Stated differently a film which is substantially conformal has a conformality of greater than about 90%, 95%, 98%, 99% or 99.5%.

One or more embodiments of the disclosure are directed to memory devices comprising a molybdenum conductive layer. In some embodiments, the molybdenum conductive layer comprises greater than or equal to about 90 at. % molybdenum, less than or equal to about 3 at. % oxygen, less than or equal to about 1 at. % iodine and less than or equal to about 10 at. % carbon, and a resistivity less than or equal to about 40 μohm-cm.

In some embodiments, the molybdenum conductive layer is formed on a barrier layer. The barrier layer of some embodiments has a thickness less than or equal to about 10 Å, 20 Å, 30 Å, 40 Å or 50 Å. In some embodiments, the molybdenum conductive layer is formed on a substrate without an intervening barrier layer.

The above disclosure relates to the deposition of metal films by a sequential pulse of reactants. The following disclosure relates to the deposition of metal films by a simultaneous or constant-flow process. In some embodiments, the sequential pulse methods are ALD methods. In some embodiments, the simultaneous or constant-flow methods are CVD methods. While the process steps differ, many of the reactants and process parameters are similar.

Figure 2:
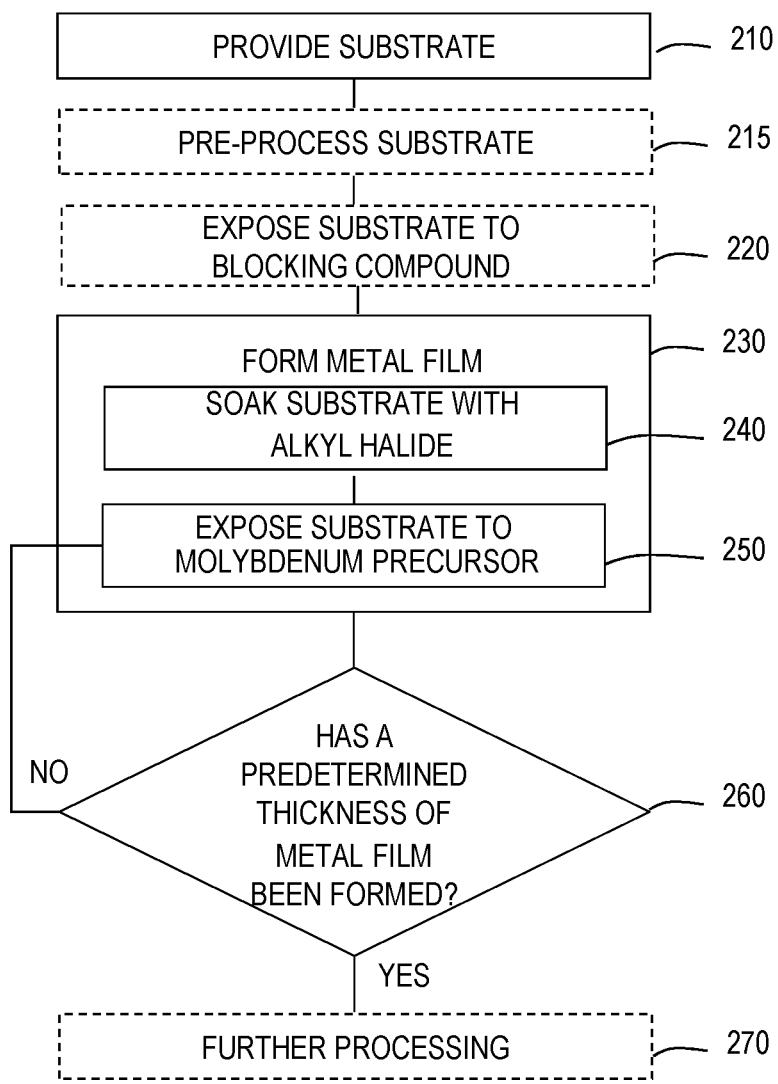
FIG. 2 illustrates an exemplary process sequence for the formation of a molybdenum layer according to one or more embodiment of the disclosure.
Figure 3:
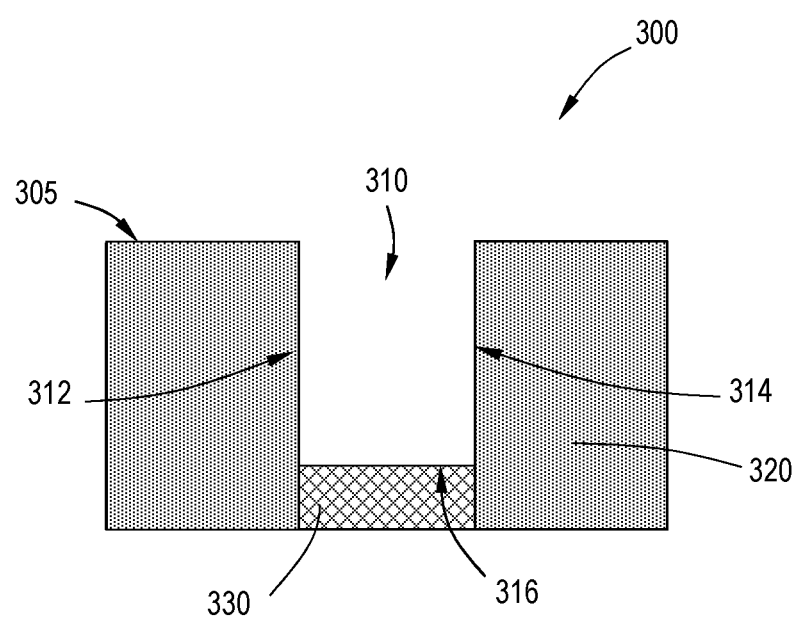
FIG. 3 shows a cross-sectional view of an exemplary substrate in accordance with one or more embodiment of the disclosure.

FIG. 2 depicts a generalized method 200 for forming a metal film on a substrate in accordance with one or more embodiment of the disclosure. FIG. 3 depicts an exemplary substrate for processing in accordance with one or more embodiment of the disclosure. The method 200 generally begins at 210, where a substrate 300 upon which a metal film is to be formed is provided and placed into a processing chamber.

Referring to FIG. 3, an exemplary substrate 300 is shown. In some embodiments, the substrate 300 has a substrate surface 305 with at least one feature 310 therein. The feature 310 has a sidewall 312, 314 and a bottom 316. In some embodiments, a dielectric material 320 forms the sidewall 312, 314 and a metallic material 330 forms the bottom 316. The skilled artisan will recognize that the illustrated embodiment refers to two sidewalls, as in a trench-like structure, but that the disclosure is not limited to trenches. In some embodiments, the feature comprises a round via with, technically, has a single round sidewall that would appear as two sidewalls in a cross-sectional view, as shown.

In some embodiments, the substrate 300 may undergo one or more optional pre-processing steps. At 215, the substrate may optionally have one or more layers formed on the substrate surface.

In some embodiments, a metal nitride liner is deposited in the feature 310. In some embodiments, the metal nitride liner comprises titanium nitride. In some embodiments, the metal nitride liner has a thickness in a range of about 15 Å to about 40 Å. In some embodiments, the metal nitride liner has a thickness of about 20 Å or about 30 Å. In some embodiments, there is no liner formed in the feature prior metal film formation. In some embodiments, there is no liner between the metal film and the bottom of the feature.

In some embodiments, a seed layer is deposited on the substrate surface. In some embodiments, the seed layer is a conformal layer. In some embodiments, the seed layer is continuous. In some embodiments, the thickness of the seed layer is in a range of about 1 nm to about 5 nm, or in a range of about 1 nm to about 4 nm. In some embodiments, the seed layer comprises a molybdenum layer deposited by a known atomic layer deposition method. In some embodiments, the seed layer is deposited by an ALD cycle comprising a molybdenum precursor exposure and an alkyl halide exposure with intervening purges. In some embodiments, the seed layer is deposited by an ALD cycle comprising a molybdenum precursor exposure and an ammonia plasma exposure with intervening purges.

In some embodiments, the bottom 316 comprises a metal and the optional pre-process comprises a cleaning process. In some embodiments, the metal bottom 316 of the feature is cleaned to remove oxides from the metal prior to formation of a metal film in the feature.

At 220, the substrate is optionally exposed to a blocking compound. This process step is described more fully below and may be useful for controlling the selectivity of the deposition process on a substrate comprising both a metal surface and a dielectric surface.

At 230, a metal film is formed on the substrate. The metal film of some embodiments is formed by exposing the substrate to a metal precursor and an alkyl halide catalyst while the substrate is maintained at a deposition temperature. In some embodiments, the alkyl halide catalyst and the metal precursor are exposed the substrate at the same time. In some embodiments, the metal precursor and the alkyl halide catalyst are exposed to the substrate separately and sequentially. In embodiments with separate exposures, each "cycle" is a single exposure to the alkyl halide catalyst and the metal precursor, in either order. The process of forming the metal film at 230 may begin by soaking the substrate with a catalytic gas. The catalytic gas comprises an alkyl halide and is exposed to the substrate for a first period of time, as shown at 240. In some embodiments, the catalytic gas comprises an alkyl halide catalyst that forms a catalyst layer on the metal bottom of the feature.

The alkyl halide may be any suitable reactant to adsorb a layer on the substrate for later reaction. Stated differently, soaking the substrate in the alkyl halide forms an activated substrate surface. The alkyl halide is described above and elsewhere herein.

The alkyl halide may be provided to the processing chamber in one or more pulses or continuously. In some embodiments, the alkyl halide is provided with an inert carrier gas and is referred to the alkyl halide containing gas. The flow rate and pressure of the alkyl halide or alkyl halide containing gas can be any suitable values. Exemplary flow rates and pressures disclosed elsewhere herein for the alkyl halide containing gas are also applicable in this embodiment.

The period of time that the substrate is soaked in the alkyl halide may be any suitable amount of time necessary to allow the alkyl halide to form an adequate adsorption layer on the substrate surface(s). For example, the alkyl halide may be allowed to soak the substrate for a period of greater than about 3 seconds or greater than about 5 seconds. In some embodiments, the soak period is in a range of about 3 seconds to about 60 seconds.

In some embodiments, an inert gas may additionally be provided to the process chamber at the same time as the alkyl halide containing gas. The inert gas may be mixed with the alkyl halide (e.g., as a diluent gas) or be provided separately and can be pulsed or of a constant flow. The inert gas may be any inert gas, for example, such as argon, helium, neon, or combinations thereof.

Next, at 250, the substrate is exposed to a second process gas for a second period of time. The second process gas comprises a metal precursor which reacts with the adsorbed layer of alkyl halide or halogen on the substrate surface to deposit a metal film. The second reactive gas may also be referred to as the metal precursor gas.

The metal precursor may be any suitable precursor to react with the adsorbed alkyl halide layer or halogen layer on the substrate. Suitable metal precursors are described elsewhere herein.

The metal precursor is delivered to the processing chamber as a metal precursor gas. The metal precursor gas may be provided in one or more pulses or continuously. The flow rate and pressure of the metal precursor gas can be any suitable flow rate and pressure. Exemplary values for flow rate and pressure are discussed elsewhere herein.

The period of time that the substrate is exposed to the metal precursor gas may be any suitable amount of time necessary to allow the metal precursor to react with the adsorbed halogen on the substrate surface. For example, the process gas may be flowed into the process chamber for a period of greater than or equal to about 60 seconds. In some embodiments, the period of exposure to the metal precursor is about 100 seconds, about 200 seconds, about 300 seconds, about 400 seconds or about 500 seconds.

Next, at 260, it is determined whether the metal film has achieved a predetermined thickness. If the predetermined thickness has not been achieved, the method 200 returns to 250 to continue exposing the substrate to the metal precursor until the predetermined thickness is reached. Once the predetermined thickness has been reached, the method 200 can either end or proceed to 270 for optional further processing. In some embodiments, the metal film may be deposited to form a total layer thickness of about 10 Å to about 10,000 Å, or in some embodiments, about 20 Å to about 1000 Å, or in some embodiments, about 50 Å to about 200 Å.

Some embodiments of the disclosure selectively deposit a metal film on a metal surface over a first dielectric surface. These methods are similar to method 200 as described above. The substrate provided comprises a dielectric surface and a metal surface. In some embodiments, a substrate as shown in FIG. 3 is processed to selectively form bottom up gap fill on the metal surface at the bottom 316 of the feature 310.

The metal of the metal film and the metal of the substrate surface may be the same metal or may be different metals. The dielectric surface may be formed from any suitable dielectric material. In some embodiments, the dielectric material comprises nitrogen or oxygen atoms. Without being bound by theory, it is believed that these materials react with the alkyl halide and prevent the halogen from adsorbing onto the substrate surface so as to catalyze the reaction with the metal precursor. Accordingly, little, if any, metal film is formed on the dielectric surface.

In some embodiments, the deposition temperature is below the decomposition temperature of the alkyl halide. Again, without being bound by theory, it is believed that if the alkyl halide decomposes, the halogen will be available for reaction with the metal precursor on all surfaces (regardless of composition), leading to metal film deposition on all substrate surfaces, including the dielectric surface. In some embodiments, the deposition temperature is at or above the decomposition temperature of the alkyl halide.

Some embodiments of this disclosure advantageously provide methods for controlling the deposition of a metal film. In some embodiments, the rate of deposition is controlled. In some embodiments, the location of deposition is controlled.

The methods of various embodiments use methods of atomic layer deposition (ALD) or chemical vapor deposition (CVD) to form the metal films. The above disclosure describes an exemplary ALD process with respect to FIG. 1 and an exemplary CVD process with respect to FIG. 2.

As stated previously, the generalized deposition processes shown in FIGS. 1 and 2 are performed as thermal processes without the use of plasma reactants. The use and effect of plasmas and other additional reactants is discussed further below.

Some embodiments of the disclosure advantageously provide methods of depositing metal films within substrate features or other structures. Exemplary features or structures include, but are not limited to, trenches and vias.

Some embodiments of the disclosure advantageously provide deposition control methods for reducing film deposition outside of a target feature and near the feature opening. Without being bound by theory, it is believed that reducing deposition in these areas allows faster gapfill within the target feature and reduces clogging near the feature opening and formation of voids or seams within the feature.

Referring to FIGS. 1 and 2, without limiting the scope of the above disclosure, both the ALD and CVD processes described above utilize an alkyl halide and a metal precursor to deposit a metal film. Without being bound by theory, it is believed that the alkyl halide functions as a catalyst in the deposition of the metal film. Accordingly, as particularly evidenced by the CVD process, a single exposure of the substrate surface to an alkyl halide can be used to deposit a thickness of more than 10 nm of metal film.

Figure 4:
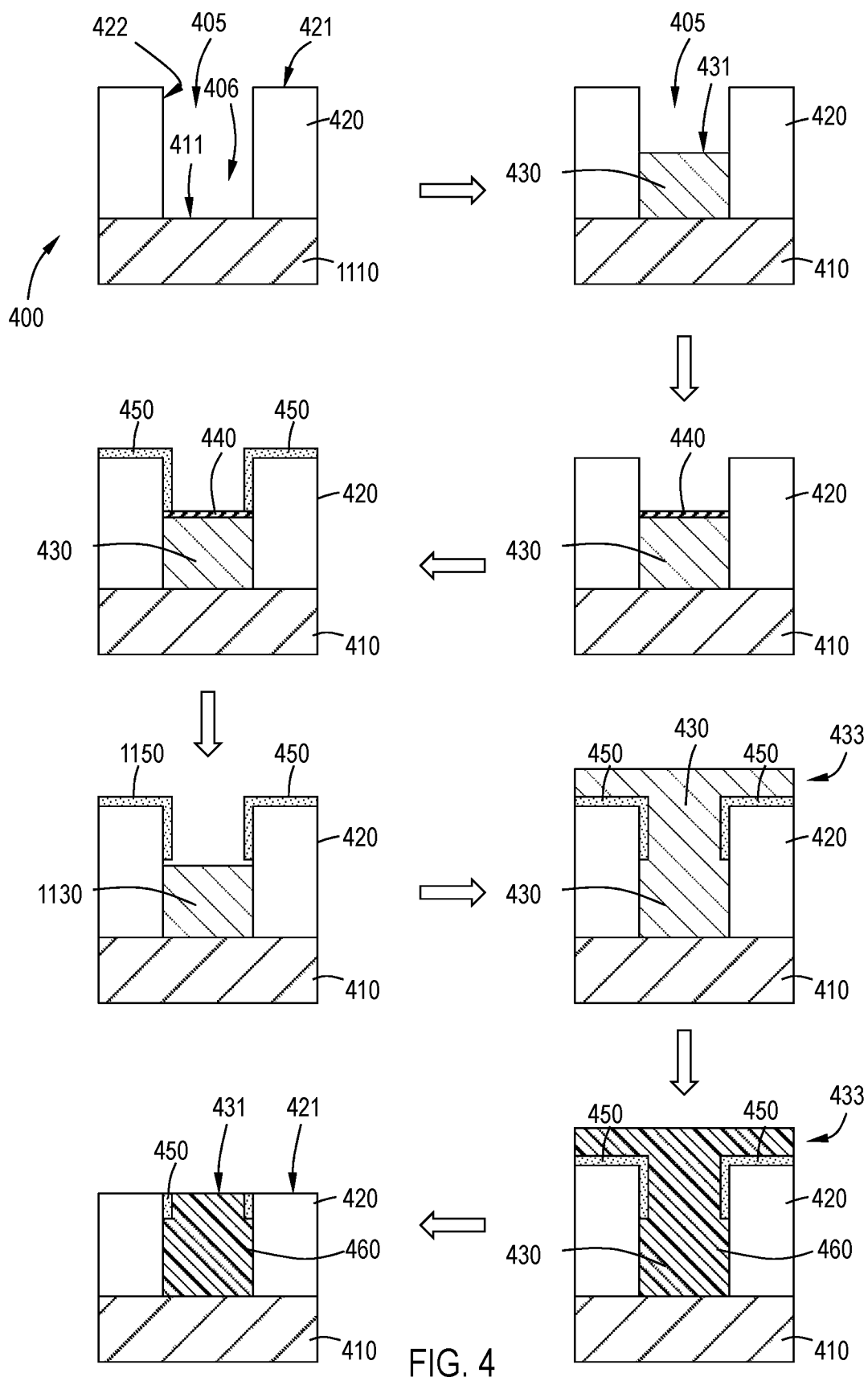
FIG. 4 illustrates an exemplary method for seam-free gap filling according to one or more embodiment of the disclosure.

FIG. 4 illustrates a process for seam-free gap fill according to one or more embodiment of the disclosure. The substrate 400 illustrated has at least one feature 405 with a first metal 410 at the bottom 406 of the feature 405 and at least one dielectric sidewall 420. The first metal 410 has a first metal surface 411 that is exposed within the feature 405. The dielectric sidewall 420 has a top surface 421 outside of the feature 405 and one or more sidewall surface 422 within the feature 405.

In some embodiments, the substrate 400 is exposed to an optional cleaning process. The cleaning process cleans the first metal surface 411 at the bottom 406 of the feature 405. In some embodiments, the cleaning process removes oxides from the first metal surface 411. The cleaning process of some embodiments comprises degassing the substrate with or without hydrogen, an argon sputter with or without hydrogen, water vapor cleaning or APC clean.

In some embodiments, a metal film 430 is deposited using a catalyst-enhanced chemical vapor deposition (CECVD) process. A metal film 430 (e.g., a molybdenum film) is selectively deposited on the first metal 410 to cover the first metal surface 411. The metal film 430 is deposited to a thickness that partially fills the feature 405 so that the top surface of the metal film 431 is below the top surface 421 of the dielectric 420.

A blocking layer 440 is optionally formed on the top surface 431 of the metal film 430. The blocking layer 440 can be any suitable material known to the skilled artisan that can prevent deposition of a liner material on the top surface 431 of the metal film 430. In some embodiments, the blocking layer 440 comprises a self-assembled monolayer (SAM).

In some embodiments, a conformal liner 450 is formed on the dielectric sidewall 422 and the top surface 421 of the dielectric 420. In some embodiments there is substantially no conformal liner 450 formed on the top surface 431 of the metal film 430 or on the optional blocking layer 440. As used in this manner, the term "substantially no" means that less than or equal to about 10%, 5%, 2% or 1% of the surface area of the metal film 430 or the optional blocking layer 440 has liner material deposited thereon. This does not include the edges of the sidewalls where the sidewall intersects the top surface of the metal film or the optional blocking layer. In some embodiments, the conformal liner 430 has a thickness less than or equal to about 30 Å, 25 Å or 20 Å. In some embodiments, the conformal liner 430 has a thickness sufficient to form a continuous film. In some embodiments, the conformal liner 430 comprises titanium nitride (TiN) and/or tantalum nitride (TaN).

In some embodiments, the blocking layer 440 is optionally removed from the top surface 431 of the metal films 430. The blocking layer 440 can be removed by any suitable technique known to the skilled artisan.

In some embodiments, the feature 405 is filled with the metal film 430 to 430 form an overburden 433 that covers the conformal liner 450 on the dielectric sidewall and the top surface of the dielectric.

In some embodiments, the metal film 430 is optionally annealed to change some property of the film and form an annealed metal film 460. For example, in some embodiments, the metal film 430 is annealed to increase the density of the film. Annealing can be done by any suitable technique under any suitable conditions known to the skilled artisan.

In some embodiments, a portion of the annealed metal film 460 (or the metal film 430 if not annealed) is removed by any suitable technique. In some embodiments, a portion of the annealed metal film 460 (or metal film 430) and at least some of the conformal liner 450 is removed to expose the top surface 421 of the dielectric 420. In some embodiments, a portion of the annealed metal film 460 (or metal film 430) and a portion of the dielectric 420, and at least some of the conformal liner 450 is removed. In some embodiments, all of the conformal liner 450 is removed. In some embodiments, the annealed metal film 460 (or metal film 430), the conformal liner 450 and the portion of the dielectric 420 is removed by chemical-mechanical planarization.

In some embodiments, one or more of the blocking layer 440 or conformal liner 450 are deposited prior to formation of the metal film 430, so that the blocking layer 440 forms directly on the first metal 410. In some embodiments, the blocking layer 440 is removed from the first metal 410 surface prior to depositing the metal film 430. In some embodiments of this sort, the deposition of the metal film 430 proceeds with an initial ALD process and then a CECVD process to grow the metal film.

In some embodiments, a combination of atomic layer deposition and catalyst enhanced chemical vapor deposition is used. The ALD portion of some embodiments follows a sequence of metal precursor (e.g., molybdenum precursor) soaking, a purge, catalyst precursor (e.g., iodine precursor) soak, and purge. The individual exposures during the ALD portion, according to some embodiments, have short durations. In some embodiments, the soaking portions are performed for less than 10 seconds, 5 second, 4 seconds, 3 seconds or 2 seconds. In some embodiments, the metal precursor soak is longer than the catalyst precursor soak. In some embodiments, the purging portions are performed for less than 5 second, 4 seconds, 3 seconds, 2 seconds or 1 second. The CECVD portion of a process, whether coupled to an ALD segment or not, typically has longer pulse times and a different pulse sequence. The CECVD sequence of some embodiments comprises a catalyst precursor soak, followed by a metal precursor soak, then a purge. The catalyst precursor soak of some CECVD embodiments has a duration in the range of 5 seconds to 300 seconds, 10 seconds to 240 seconds, 15 seconds to 210 seconds, 20 seconds to 180 seconds, 25 seconds to 120 seconds or 30 seconds to 60 seconds. In some embodiments, the metal precursor soak of some CECVD embodiments has a duration in the range of 20 seconds to 1200 seconds, 30 seconds to 800 seconds, 40 seconds to 600 seconds, 50 seconds to 450 seconds or 60 seconds to 300 seconds. In some embodiments, the catalyst soak has a shorter duration than the metal soak. In some embodiments, the purge has a duration in the range of 1 second to 100 seconds, 2 seconds to 80 seconds, 3 seconds to 60 seconds, 4 seconds to 30 seconds or 5 seconds to 10 seconds.

In some embodiments, the process comprises an initial ALD type process to build a thickness of the second metal. Once a predetermined thickness of the second metal has been formed, the CECVD process is performed repeatedly to grow a film with a predetermined thickness. In some embodiments, the CECVD process is not effective for second metal growth without an initial layer of the metal deposited by a selective ALD process. The ALD type sequence of some embodiments deposits the second metal at a faster rate than the CECVD process. In some embodiments, after forming a metal film 430 to a predetermined thickness (e.g., to the top of the feature), the process sequence switches to an ALD type sequence. The metal film can then be further processed as described herein.

In some embodiments, the molybdenum film is grown using a combination of CVD and ALD processes. In some embodiments, the substrate is exposed to a gaseous mixture of a molybdenum precursor and a reactant. After an amount of film has been deposited, one of the precursor or reactant flow is stopped and the deposition moves to an ALD regime where there are substantially no gas phase reactions of the molybdenum precursor and the reactant.

Some embodiments of the disclosure are directed to 3D NAND devices in which the wordline is formed by one or more embodiment of the disclosure. In some embodiments, a bare wordline is deposited using one or more embodiment of the disclosure and then the wordline, as part of the memory device, is exposed to rapid thermal processing at temperatures greater than 850° C., 900° C., 950° C. or 1000° C. In some embodiments, the RTP process has a duration up to about 2 minutes, 1 minute or 30 seconds, with substantially no pullup of the molybdenum film.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a seam-free gap fill, the method consisting of:
depositing a second metal film in a feature on a substrate to partially fill the feature with the second metal film by a process using a zero-valent metal arene precursor and an alkyl halide catalyst, the feature comprising a bottom and at least one sidewall, the bottom comprising a first metal and the at least one sidewall comprising a dielectric, the second metal film forming selectively on the bottom relative to the at least one sidewall and having a top surface below a top surface of the dielectric;
depositing a liner on the sidewall of the feature above the second metal film and the top surface of the dielectric, substantially no liner deposited on the top surface of the second metal film within the feature;
filling the feature with the second metal film to cover the liner and the top surface of the dielectric; and
removing the second metal film, the liner from the top surface of the dielectric and at least some of the dielectric, leaving some of the liner within the feature, to form a seam-free gap fill, wherein the first metal comprises one or more of cobalt, tungsten, ruthenium or molybdenum and the second metal film comprises one or more of tungsten, ruthenium or molybdenum.

2. The method of claim 1, wherein the metal precursor comprises a metal atom bonded to one or more of an optionally alkyl substituted benzene ring and an open or closed diene.

3. The method of claim 1, wherein the alkyl halide consists essentially of iodoethane or diiodomethane.

4. The method of claim 1, wherein the metal precursor and the alkyl halide catalyst are exposed to the substrate together.

5. The method of claim 1, wherein the metal precursor and the alkyl halide catalyst are exposed to the substrate separately and sequentially in a cycle.

6. The method of claim 1, wherein the second metal film has a growth rate greater than or equal to about 0.8 Å/cycle.

7. A method of forming a seam-free gap fill, the method consisting of:
cleaning a first metal at a bottom of a feature on a substrate to remove oxides from the first metal, the feature comprising the bottom and at least one sidewall, the at least one sidewall comprising a dielectric;
depositing a second metal film in a feature on a substrate to partially fill the feature with the second metal film by a process using a zero-valent metal arene precursor and an alkyl halide catalyst, the alkyl halide catalyst exposed to the substrate prior to the zero-valent metal arene precursor such that a catalyst layer is formed on the first metal at the bottom and, optionally, on the dielectric, and the second metal film forms selectively on the bottom relative to the at least one sidewall and has a top surface below a top surface of the dielectric;
optionally exposing the substrate with the catalyst layer on the bottom of the feature to an anisotropic etch to remove any catalyst from the dielectric;
forming a blocking layer on the top surface of the second metal film, the blocking layer preventing deposition on the top surface of the second metal film;
depositing a liner on the sidewall of the feature above the second metal film and the top surface of the dielectric, substantially no liner deposited on the top surface of the second metal film within the feature;
removing the blocking layer from the top surface of the second metal film;
filling the feature with the second metal film to cover the liner and the top surface of the dielectric;
annealing the second metal film after filling the feature with the second metal film; and
removing the second metal film, the liner from the top surface of the dielectric and at least some of the dielectric, leaving some of the liner within the feature, to form a seam-free gap fill, wherein the first metal comprises one or more of cobalt, tungsten, ruthenium or molybdenum and the second metal film comprises one or more of tungsten, ruthenium or molybdenum.

* * * * *